(12) United States Patent
Dyckman et al.

(10) Patent No.: US 7,085,143 B1
(45) Date of Patent: Aug. 1, 2006

(54) IN-MODULE CURRENT SOURCE

(75) Inventors: Warren D. Dyckman, Peekskill, NY (US); Edward R. Pillai, Wappingers Falls, NY (US); Daniel P. O'Connor, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,694

(22) Filed: May 23, 2005

(51) Int. Cl.
  *H05K 7/02* (2006.01)
  *H01L 29/00* (2006.01)
  *H01L 21/00* (2006.01)
(52) U.S. Cl. .................. 361/820; 257/724; 438/106
(58) Field of Classification Search ............... 361/820; 257/724; 438/106
   See application file for complete search history.

(56) References Cited

U.S. PATENT DOCUMENTS

| | | | |
|---|---|---|---|
| 4,651,020 A * | 3/1987 | Kenny et al. ............... 307/43 |
| 6,175,509 B1 * | 1/2001 | Koch .......................... 361/809 |
| 6,396,137 B1 | 5/2002 | Klughart | |
| 6,646,425 B1 | 11/2003 | Miftakhutdinov | |
| 6,791,305 B1 | 9/2004 | Imai et al. | |
| 6,803,350 B1 | 10/2004 | Lantuejoul et al. | |
| 2002/0008565 A1 * | 1/2002 | Ang et al. .................. 327/530 |
| 2003/0181075 A1 * | 9/2003 | Hartke et al. .................. 439/67 |
| 2004/0222514 A1 | 11/2004 | Crane, Jr. et al. | |

* cited by examiner

*Primary Examiner*—Evan Pert
(74) *Attorney, Agent, or Firm*—Gibb I.P. Law Firm, LLC; James J. Cioffi, Esq.

(57) ABSTRACT

Disclosed is a method and structure for locally powering a semiconductor chip within a package. The structure and method incorporate a local voltage regulator mounted adjacent a semiconductor chip on a top surface of a carrier. The voltage regulator is electrically connected to a power plane disposed within the carrier. The voltage regulator continuously senses the reflected voltage of the power plane at a regulated output port and actively cancels time domain noise within its operational bandwidth. Mounting the voltage regulator on top of the carrier adjacent to the chip minimizes loop inductance between the regulator and power plane and also minimizes delay caused by impedance of the power plane on the current flowing to the chip.

20 Claims, 9 Drawing Sheets

IN-MODULE CURRENT SOURCE

BACKGROUND OF THE INVENTION

1. Field of the Invention

The present invention relates to a semiconductor package and, more particularly, to a semiconductor package with a local voltage regulator to instantaneously provide a voltage-regulated current to power a chip within the semiconductor package.

2. Description of the Related Art

A semiconductor circuit module is an electrical component on which a chip, including a circuit or an integrated circuit is built. The circuit module can be mounted on a top surface of a specialized common carrier (SCC) that is encased within a semiconductor package for protection from the environment. The outer surface of the SCC can be electrically connected to a printed circuit board through conductive leads that extend through the bottom or sides of the SCC. The printed circuit board can connect the SCC to a power source, providing a current that can be distributed across the SCC to semiconductor chip interconnects. The integrated circuits on semiconductor chips are becoming increasingly faster. As the speed required for semiconductor chip performance increases, so does the need to provide enough power and current to the circuits within the semiconductor chip to accommodate the increasing speeds. For example, as the rate of high speed switching (HSS) circuits (e.g., complimentary metal oxide semiconductor (CMOS) structures, Bipolar-CMOS structures, and silicon germanium structures with switching rates in the range of 6.25 to 20 gigabytes per second or greater) increases, the power requirements for semiconductor chips containing such circuits may include higher voltage currents at lower potentials with low impedances. Many HSS circuits have only decoupling capacitors that provide an imperfect (e.g., inductive in most cases) AC path to ground for noise and ground signal return paths. These HSS circuits have very high instantaneous current demands that are required in order to maintain the integrity of the voltage wave shapes. Fluctuations in power may cause performance errors or damage the circuits. Thus, the requirement for lower source impedance and the ability to control parasitic circuit elements are the practical limiting factors for HSS circuit packaging development.

SUMMARY OF THE INVENTION

This disclosure presents, in one embodiment, a semiconductor package structure incorporating a local voltage regulator mounted on the carrier in order to instantaneously provide a voltage-regulated current to power a semiconductor chip also mounted on the carrier within the semiconductor package. More particularly, the semiconductor package comprises a dielectric carrier having an outer surface, including a top surface. Mounted on the top surface of the carrier is a semiconductor chip. Positioned horizontally within the carrier and approximately parallel to the top surface is a power plane that is electrically connected to the semiconductor chip. At least two ground planes (i.e., first and second ground planes) are positioned within the carrier between the power plane and the top surface. The power plane is adapted to receive a current and to deliver the current to the semiconductor chip. Mounted on the carrier adjacent the semiconductor chip, either separately or as component of a circuit module, is a voltage regulator that is also electrically connected to the power plane. The voltage regulator is adapted to regulate the current across the power plane to a voltage reference level that is sufficient to power the semiconductor chip by establishing a feedback loop. More specifically, the voltage regulator is adapted to receive the current from the power plane, to compare the voltage of the current to the voltage reference level, to actively adjust the voltage of the current to create a voltage-regulated current and to flow the voltage-regulated current back to the power plane.

Additionally, because loop inductance can be formed within feedback loop between the voltage regulator and the power plane (e.g., by mutual inductance between the ground planes) and because of impedance across the power plane, the voltage regulator must be positioned as close to the chip and the power plane as possible. More specifically, the first and second ground planes can be positioned horizontally within the carrier between the top surface of the carrier and the power plane. A first regulator via extends through the top surface of the carrier to the first ground plane, electrically connecting the voltage regulator to the first ground plane and the second ground plane. A second regulator via extends through the top surface of the carrier to the power plane, electrically connecting the regulator to the power plane, the first ground plane and the second ground plane. Thus, the first ground plane, the first regulator via, the second ground plane and the second regulator via form an inductance loop within the feedback loop between the voltage regulator and the power plane. This inductance loop resists changes in current flow to the power plane. Additionally, the first ground plane, the second ground plane and the power plane comprise conductive planes that provide a low impedance path between the voltage regulator and the semiconductor chip. To minimize loop inductance between the planes as well as to minimize the impedance effect across the power plane, the voltage regulator must be placed as close as possible to both the chip and the power plane. Positioning the regulator in this manner, allows the regulator to effectively make real-time adjustments to the current passing to the semiconductor chip.

Additional vias within the semiconductor package can include a semiconductor chip via and a current source via. The semiconductor chip via electrically connects the semiconductor chip to the power plane, the first ground plane and the second ground plane. The semiconductor chip via extends down from the location of the semiconductor chip on the top surface of the carrier through to the power plane. The current source via is electrically connected to an external current source at the outer surface of the carrier (e.g., a current source from a printed circuit board). The current source via extends through the outer surface (e.g., a bottom surface) of the carrier to the power plane. The current source via is adapted to receive a flow of the current from the external current source and to flow the current to the power plane.

In another embodiment, this disclosure presents a method of powering a semiconductor chip mounted on a carrier, either directly or on a circuit module, and encased within a semiconductor package. More particularly, the method comprises distributing a current across a power plane that is disposed within the carrier. The voltage of the current in the power plane is locally adjusted to a voltage reference level to establish a voltage-regulated current. The process of locally adjusting the voltage of the current in the power plane comprises establishing a feedback loop of current flow between the power plane and a voltage regulator also mounted on the top surface of the carrier, either directly or on a circuit module containing the chip. The feedback loop comprises receiving a flow of current from a first location on the power plane. The voltage of the current from the first location is measured and compared to a voltage reference level. The voltage reference level is established by first and second ground planes between the power plane and top surface of the carrier. The voltage of the current is actively adjusted to the voltage reference level to establish the voltage-regulated current. The voltage-regulated current then flows back to the first location on the power plane.

Additionally, due to an inductance loop that may be formed within the feedback loop between the voltage regulator and the power plane (e.g., by mutual inductances between the ground planes) and due to impedance across the power plane, the voltage-regulated current should be adjusted from a position as close as possible to both the power plane and chip. This minimizes the loop inductance between the planes and the impedance effect on the current flowing to the chip. Thus, a steady flow of the voltage-regulated current can be maintained across the power plane and can be instantaneously deliverable to the semiconductor chip.

Therefore, the invention provides an almost perfect power source in close proximity to a semiconductor chip. The current is locally maintained at a constant voltage and a steady current flow is instantaneously available to the circuits on the chip. These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
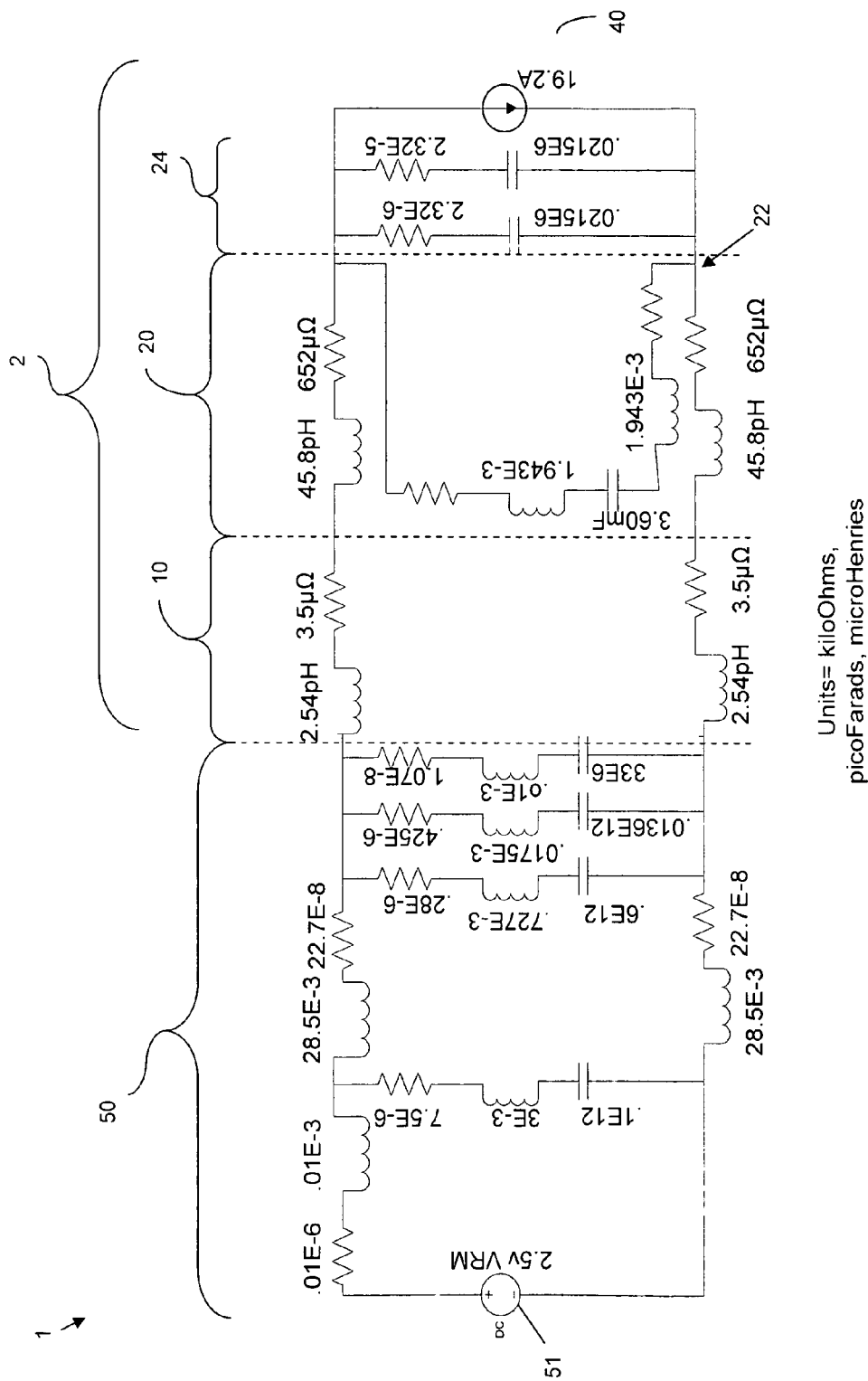
FIG. 1 is a schematic circuit diagram.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As stated above, the requirement for lower source impedance and the ability to control parasitic circuit elements are the practical limiting factors for HSS circuit packaging development. Providing sufficient power and sufficient current, often requires robust power paths vertically from the bottom surface of the carrier through to the top surface of the carrier and also requires power paths horizontally across the carrier, such that the power and current are distributed to all the semiconductor chip interconnects. Increasing the power distribution across the carrier can be accomplished by increasing the number of bottom side power supply contacts and the number of vertical power paths. However, increasing the number of bottom side power supply contacts may result in an increase in carrier size or in fewer contacts serving other functions (e.g., signal pads or wiring channels). In an attempt to ensure even distribution of power to all the semiconductor chip interconnects, power planes can be disposed horizontally across the carrier. However, fluctuations in the charge and flow of the current increase as a function of the distance between the power source and the semiconductor chip. In an attempt to be able to deliver a charge at a high enough voltage level to power a chip (e.g., for one cycle) without fluctuations and to be able to ramp to that voltage level very quickly, decoupling capacitors with high capacity are often incorporated into a circuit module.

Figure 3:
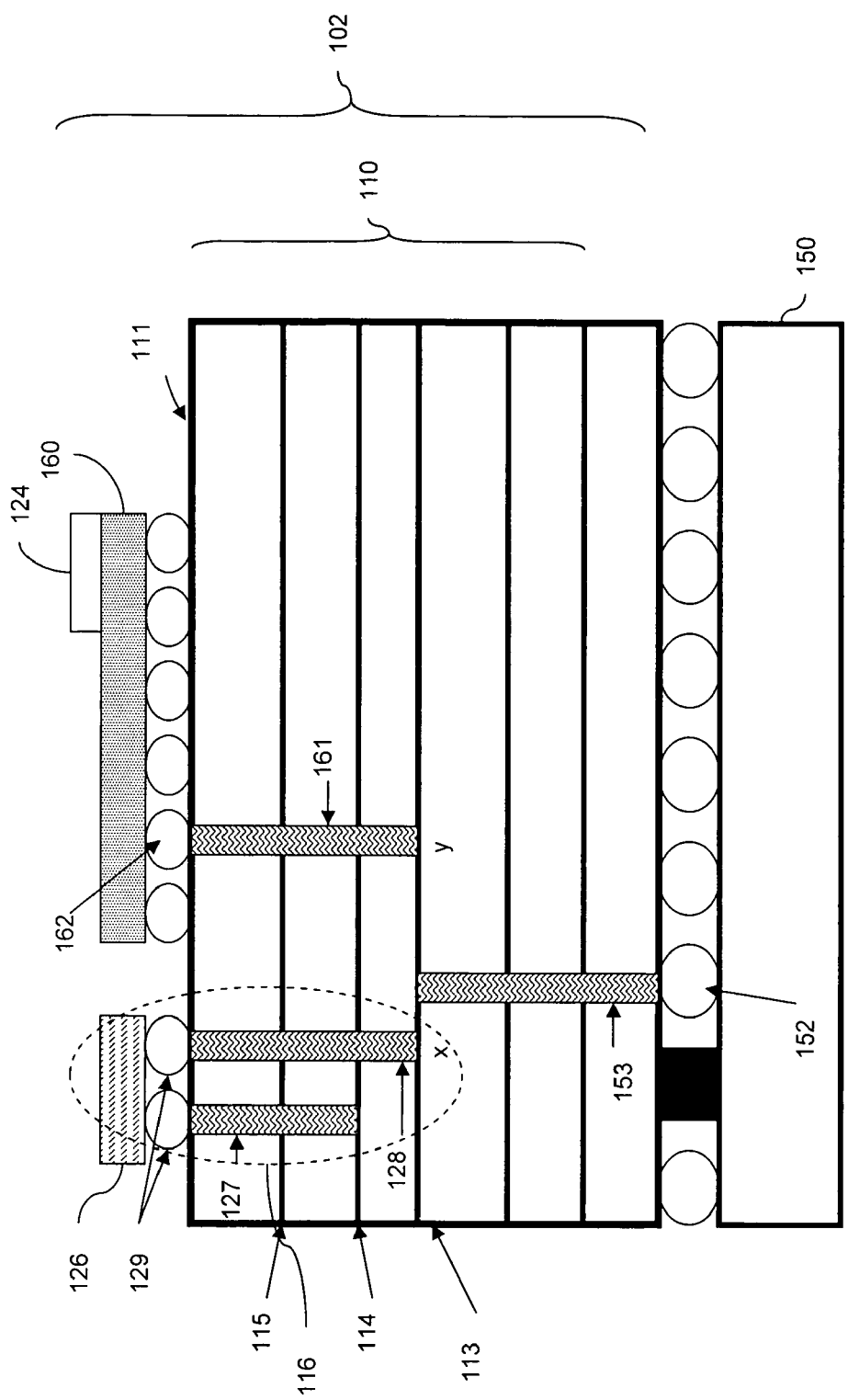
FIG. 3 is a schematic illustration of an embodiment of the present invention.

Referring to FIG. 1, a schematic circuit diagram of an exemplary circuit 1 for powering a semiconductor package 2 mounted on a printed circuit board (PCB) 50 is illustrated. The resistance, capacitance, inductance, voltage and any other values referenced in exemplary circuit 1 of FIG. 3 are presented for illustration purposes only and are not intended as limiting features of the present invention. The PCB 50 may incorporate a voltage regulator 51 (e.g., 2.5 volt constant voltage source). The semiconductor package 1 comprises a specialized common carrier (SCC) 10 adapted for mounting on the PCB 50 and a subscriber carrier module (SCM) 20 mounted on the SCC 10. Additionally, the package 1 can comprise an on-chip capacitor 24 and an on-circuit module decoupling capacitor 22. The capacitors 22, 24 are used to power the package 1 and are recharged by a current from a constant current source 40. However, such decoupling capacitors 22 often provide an imperfect (e.g., inductive) AC path to ground for noise and ground signal return paths. Due to the need for scaling and the ever increasing circuit speeds, it would be advantageous to provide a power source in close proximity to a semiconductor chip (e.g., as opposed to or in addition to the voltage regulator 51 incorporated into the PCB 50), such that a current distributed across the package and, particularly, near the chip, can be locally maintained at a constant voltage and a steady voltage-regulated current flow can be instantaneously available to circuits on the chip.

Figure 2:
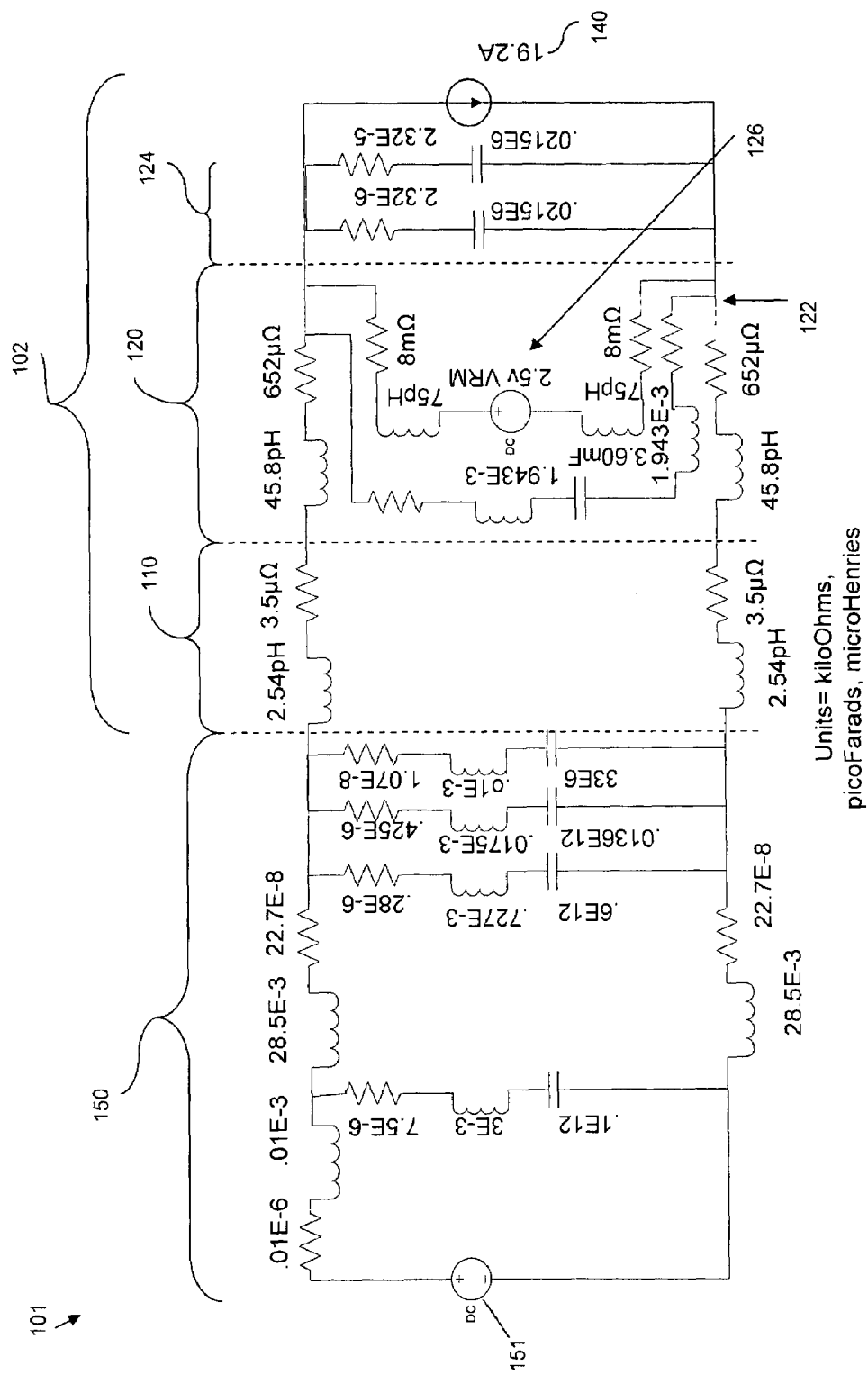
FIG. 2 is a schematic circuit diagram of an embodiment of the present invention.
Figure 4:
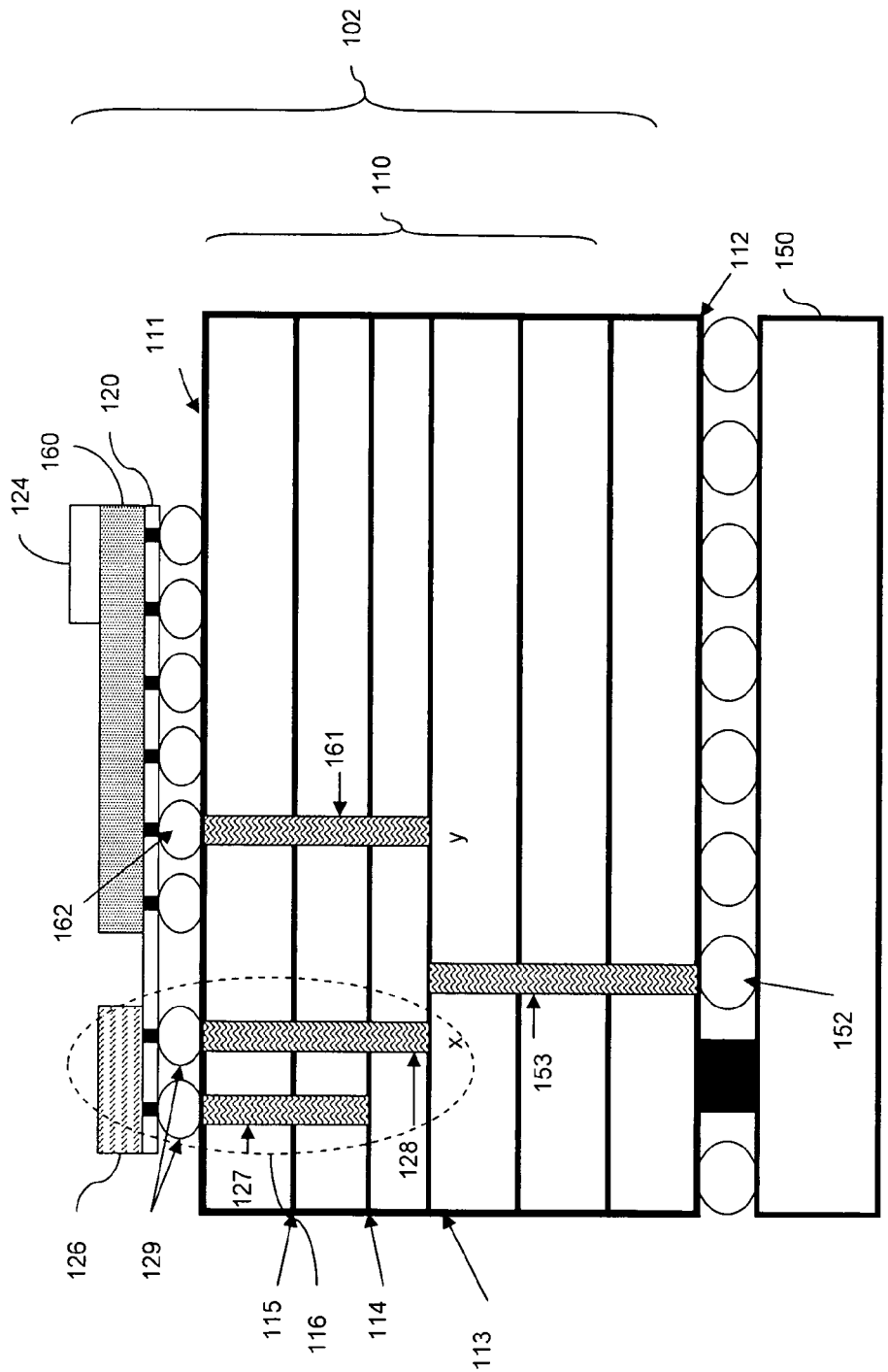
FIG. 4 is a schematic illustration of another embodiment of the present invention.

Referring to FIG. 2, a schematic circuit diagram of an exemplary circuit 101 for powering a semiconductor package 102 mounted on a printed circuit board (PCB) 150 is illustrated. The resistance, capacitance, inductance, voltage and any other values referenced in exemplary circuit 101 of FIG. 4 are presented for illustration purposes only and are not intended as limiting features of the present invention. Specifically, this disclosure presents a semiconductor package 102 incorporating a local voltage regulator 126 (e.g. 2.5 volt power supply). As with the circuit 1 of FIG. 1, the semiconductor package 102 can comprise a specialized common carrier (SCC) 110 adapted for mounting onto a PCB 150. Chips can be mounted directly to the SCC 110 or can be mounted onto a subscriber carrier module (SCM) 120 that is mounted onto the SCC 110. In order to instantaneously provide a voltage-regulated current to power a semiconductor chip mounted to the SCM 120 (or mounted directly to the SCC 110) within the semiconductor package 102, a voltage regulator 126 is also mounted on the SCM 120 (or onto the SCC 110) as close as possible next to the chip. The voltage regulator 126 can comprise a voltage regulator such as those commonly available in the industry in chip or package form. The PCB 150 may also incorporate a constant voltage source 151 (e.g., 2.5 volt voltage regulator); however, by placing a constant voltage source 126 locally on the SCM 120 or SCC 110 near a semiconductor chip, circuits within the semiconductor chip having high speed requirements (e.g., HSS circuits) can be supplied with sufficient instantaneous power having minimal fluctuations. Providing a local constant voltage source 126 within the package 102 will thus improve overall semiconductor package 102 performance and reduce the demands placed on package 102 design (e.g., by allowing for an increase in semiconductor package wireability or an increase in signal pads). Current for the package 102 is supplied to this constant voltage source (i.e., voltage regulator 126) via a constant current source 140 (e.g., 19.2 amp constant current source).

More particularly, referring to the schematic drawings of FIGS. 3 and 4, the semiconductor package 102 comprises a dielectric carrier 110 having an outer surface 112, including a top surface 111. Mounted on the top surface 111 of the carrier 110, either directly (as illustrated in FIG. 3) or as a component of a circuit module 120 (as illustrated in FIG. 4), is a semiconductor chip 160 (e.g., a chip incorporating a national semiconductor processor and requiring 19.2 amps of power per quadrant in a server application). A voltage regulator 126 is mounted on the top surface 111 of the carrier 110, either directly (as illustrated in FIG. 3) or as a component of a circuit module 120 (as illustrated in FIG. 4), adjacent to the semiconductor chip 160 (e.g., within approximately 2 mm). Disposed horizontally within the carrier 110 and approximately parallel to the top surface 111 is a power plane 113. The power plane 113 is adapted to receive a current that is sufficient to power-up the regulator 126 and to power the chip 160. The power plane 113 is electrically connected to both the regulator 126 and the chip 160 so that it may deliver the current thereto. The voltage regulator 126 is adapted to regulate the current across the power plane 113 to a voltage reference level that is sufficient to power the semiconductor chip 160 by establishing a feedback loop 116 (see FIGS. 3 and 4). At least two ground planes (i.e., first and second ground planes 115, 114) are disposed within the carrier 110 between the power plane 113 and the top surface 111 and may be used to establish a voltage reference level. The voltage regulator 126 is adapted to receive the current from the power plane 113, to compare the voltage of the current to the voltage reference level, to actively adjust the voltage of the current to create a voltage-regulated current and to flow the voltage-regulated current back to the power plane 113. Thus, the feedback loop 116 is established. More specifically, the voltage regulator 126 constantly and actively senses the reflected voltage at the regulated output port and actively cancels the time domain noise within it's operation bandwidth. This ensures an essentially pure and noise-free DC output to the semiconductor circuit (e.g., chip 160) being supplied. Using such a local voltage regulator 126 (i.e., a voltage regulator 126 on the carrier 110 (see FIG. 3) or on a circuit module 120 (see FIG. 4), thereby, reduces noise effects and also reduces the demands put onto the printed circuit board 150 design. For example, by using local voltage regulators 126, the number of circuit board 150 level voltage regulators 151 and the number of noise control devices (not shown) can be reduced, thus, potentially reducing the number of required circuit board 150 layers.

Due to loop inductance that can be created within the feedback loop 116 by mutual inductance between conductive planes (e.g., the ground planes 115, 114) and due to impedance of the power plane 113, the voltage regulator 126 should be positioned as close as possible to the chip 160 and the power plane 113 (e.g., on a top surface 111 of the carrier 110 with approximately 2 mm or less of the semiconductor chip 160). More particularly, an inductance loop can be created from multiple components within the carrier 110. For example, the carrier 110 may comprise two ground planes 115 and 114: a first ground plane 114 disposed horizontally 110 between the top surface 111 of the carrier 110 and the power plane 113 and a second ground plane 115 disposed horizontally between the top surface 111 of the carrier 110 and the first ground plane 114. These ground planes 114, 115 should be configured within the carrier 110 using existing manufacturing ground rules. A first regulator via 127 (e.g., conductor-filled channel) can extend through the top surface 111 of the carrier 110 to the first ground plane 114. The first regulator via 127 electrically connects a conductive regulator contact 129 (e.g., a solder ball located on the underside of the regulator 126 (see FIG. 3) or located on the underside of the circuit module 120 opposite the regulator 126 (see FIG. 4) and adjacent the top surface 111 of the carrier 110) and, thereby, the voltage regulator 126, to the first ground plane 114 and the second ground plane 115. A second regulator via 128 (e.g., conductor filled channel) can extend through the top surface 111 of the carrier 110 to the power plane 113. The second regulator via 128 electrically connects another conductive regulator contact 129 (e.g., solder ball located on the underside of the regulator 126 (see FIG. 3) or located on the underside of circuit module 120 opposite the regulator 126 (see FIG. 4) and adjacent the top surface 111 of the carrier 110) and, thereby, the regulator 126, to the power plane 113, the first ground plane 114 and the second ground plane 115. Consequently, the first ground plane 114, the first regulator via 127, the second ground plane 115 and the second regulator via 128 create an inductance loop in the flow of voltage-regulated current from the voltage regulator 126 to the power plane 113. This inductance loop resists adjustments being made by the voltage regulator 126 to the current flowing within the power plane 113. By forming the power plane 113 and reference planes 115, 114 closer to the top surface 111 of the carrier 110 than the bottom surface 112 of the carrier and mounting the regulator 126 on the top surface 111, the regulator 126 is positioned so as to minimize the distance between the regulator 126 and power plane 113 and thereby minimizes loop inductance (e.g., to between approximately 5 to 30 picoHenries and preferably between 16 and 25 picoHenries).

Additionally, the ground 115, 114 and power 113 planes necessarily impart some impedance on a current. However, a low impedance path between the voltage regulator 126 and the chip 160 can be obtained by using conductive mesh. For example, referring to the conductive mesh power plane 113 and ground planes 114, 115 planes of FIGS. 6 and 7, respectively, by using a conductive mesh with a minimum line width of approximately 0.066 mm and a minimum line pitch of approximately 0.2016 mm, it is possible to attain resistance values in the range of 16 milliohms +10/−5% and inductance values in the range of 150 picoHenries +10/−5%. Thus, a low impedance path to the chip 160 is achieved. However the invention is not limited to mesh conductive planes, fore example, the conductive ground 115, 114 and power 113 planes may be formed of solid conductive foil or any intermediate form of conductive plane. Regardless of the conductive material used to form the ground and power planes 115, 114, 113, positioning the voltage regulator 126 as close as possible to the chip 160 will minimize delay caused by the impedance of the power plane 113 on the current flowing to the chip 160.

Figure 5:
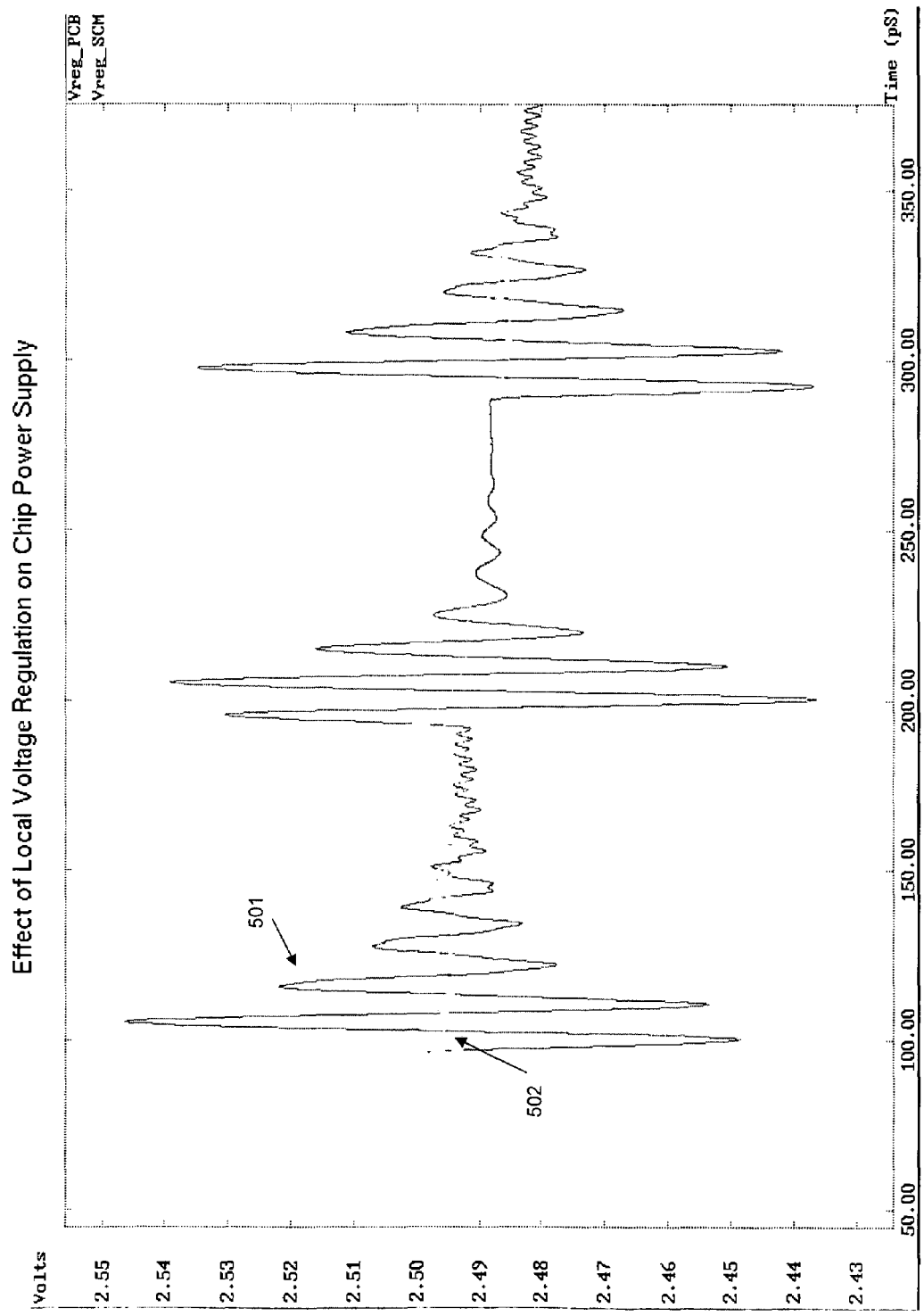
FIG. 5 is a schematic graph illustrating the relative effect of the local voltage regulation of the present invention on semiconductor chip power supply.

By using the package structure 102, the ground reference and current return path are moved from closer a typical position close to the bottom surface of the carrier 110 to a position closer to the top surface 111 of the carrier 110, thereby providing for a better overall ground reference and power distribution (i.e., resulting in less power sags and a faster response). Additionally, by using the structure 102, less resistance in the current return path from the chip 160 to the regulator 126 (e.g., 0.1 ohms) is achieved. The improved performance of the structure 102 as compared to a semiconductor package in which the voltage regulation is provided only at the circuit board level is illustrated in the graph of FIG. 5. Curve 501 depicts the large voltage fluctuations present as power is distributed from the power plane to the semiconductor chip even after attempting to regulate power plane voltage from the circuit board level. Curve 502 depicts the minimal voltage fluctuations (e.g., less than approximately 0.1 volts) present as power is distributed to a semiconductor chip incorporated into the package 102 of the present invention with local voltage regulation.

Additional, vias (e.g., conductor filled channels) within the semiconductor package 102 can include a semiconductor chip via 161 and a constant current source via 153. The semiconductor chip via 161 can electrically connect a semiconductor chip contact 162 (e.g., solder ball located on the underside of the semiconductor chip 160 (see FIG. 3) or on the underside of the circuit module 120 opposite the chip 160 (see FIG. 4) and adjacent the top surface 111 of the carrier 110) and, thereby, the semiconductor chip 160 to the power plane 113, the first ground plane 114 and the second ground plane 115. The semiconductor chip via 161 extends down from the location of the semiconductor chip 160 on the top surface 111 of the carrier 110 through to the power plane 113. One or more current source vias 153 can extend through an outer surface 112 of the carrier 110 (e.g., a bottom surface) to the power plane 113. The current source vias 153 are electrically connected to an external current source. For example, one or more current source vias 153 may contact one or more corresponding bottom side power source contacts 152 (e.g. solder balls used to mount the carrier 110 to the PCB 150 and adapted to act as either power source or signal contacts) and the current source may flow from within the PCB 150 through the bottom side power source contacts 152 and the current source vias 153 to the power plane 113. The number of current source vias 152 and the respective number of bottom side power source contacts 153 should be equal to the minimum number required to provide for proper power-up of the regulator 126 and powering of the chip 160. However, due to the positioning of the local regulator 126 within the package 102, the total number of bottom side contacts (i.e., carrier pads) that are dedicated power source contacts 152 is reduced thereby freeing up a greater number of bottom side contacts to be used as signal contacts as compared to the signal to power contacts ratio used in the industry. Another advantage of this structure 102 is that the number of module input/outputs (I/O) required for power distribution can be reduced. Although a significant number are still required for return paths, the size of the substrate can be reduced by 10–15%. For example, a 42.5 mm substrate can be reduced to a 37.5 mm with the same number of signal I/O and still have more stable power delivered to the chip 160 circuits. The reduced number of bottom contacts 152 required not only frees up bottom side contacts to be used as signal contacts, but also frees up wiring channels for improved carrier 110 wireability. The reduced number of bottom side power contacts 152 will also aid in reducing the total number of layers in the carrier 110, since power management is performed on the top side 111 of the carrier 110 and not from within the carrier 110 or from the printed circuit board 150.

Referring to FIGS. 2–4 and 8–9 in combination, a method of powering a semiconductor chip 160 mounted on a carrier 110 (e.g., either directly as illustrated in FIG. 3 or through a circuit module 120 as illustrated in FIG. 4) and encased within a semiconductor package 102 is disclosed. The method comprises distributing a current across a power plane 113 that is disposed within a carrier 110 that can be mounted on to a printed circuit board 150 (802). The current can be provided to the power plane 113 from circuit board level constant current source 140 that is optionally regulated to some degree by a circuit board level voltage regulator 151. The voltage of the current in the power plane 113 is continuously adjusted to a voltage reference level by a local voltage regulator 126 to establish a voltage-regulated current throughout the power plane 113 (804).

Figure 9:
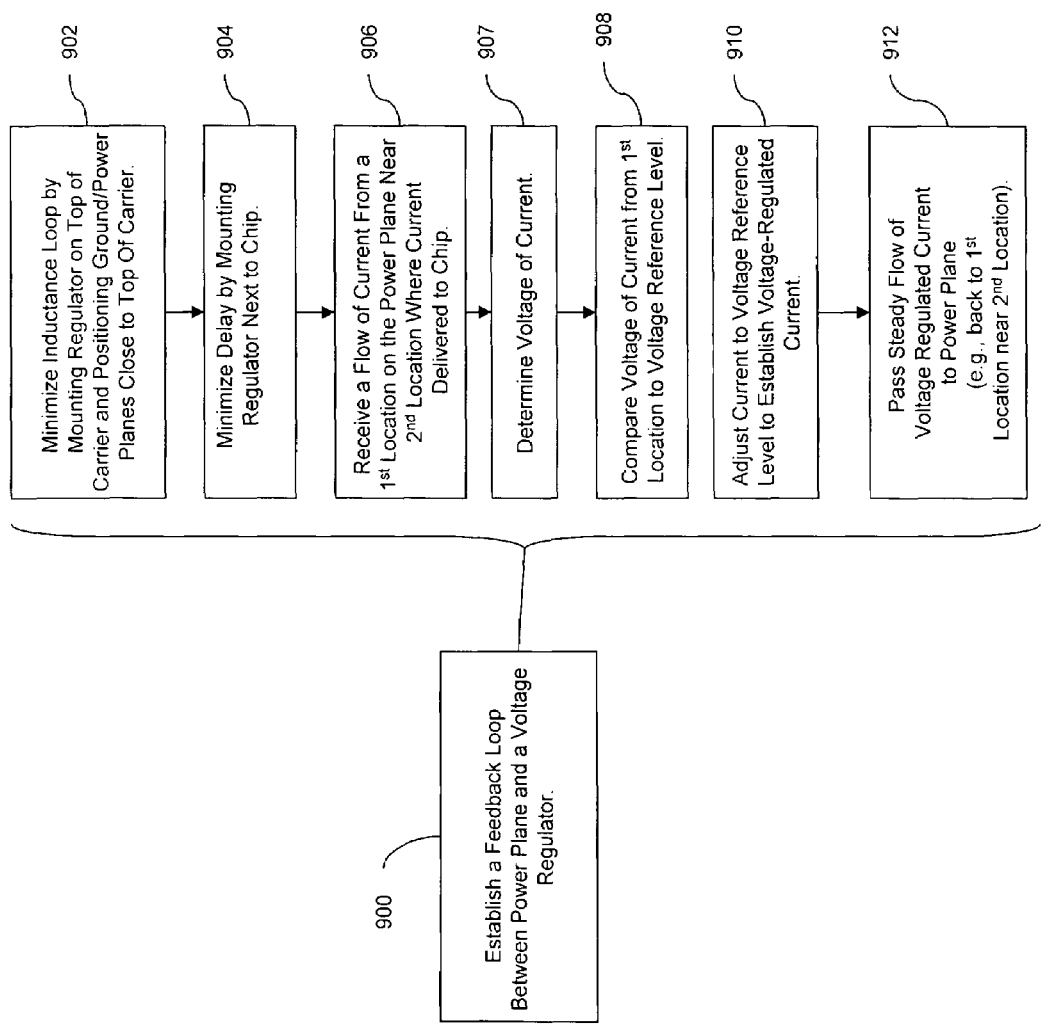
FIG. 9 is a schematic flow diagram illustrating the method process 804 of FIG. 8.
Figure 6:
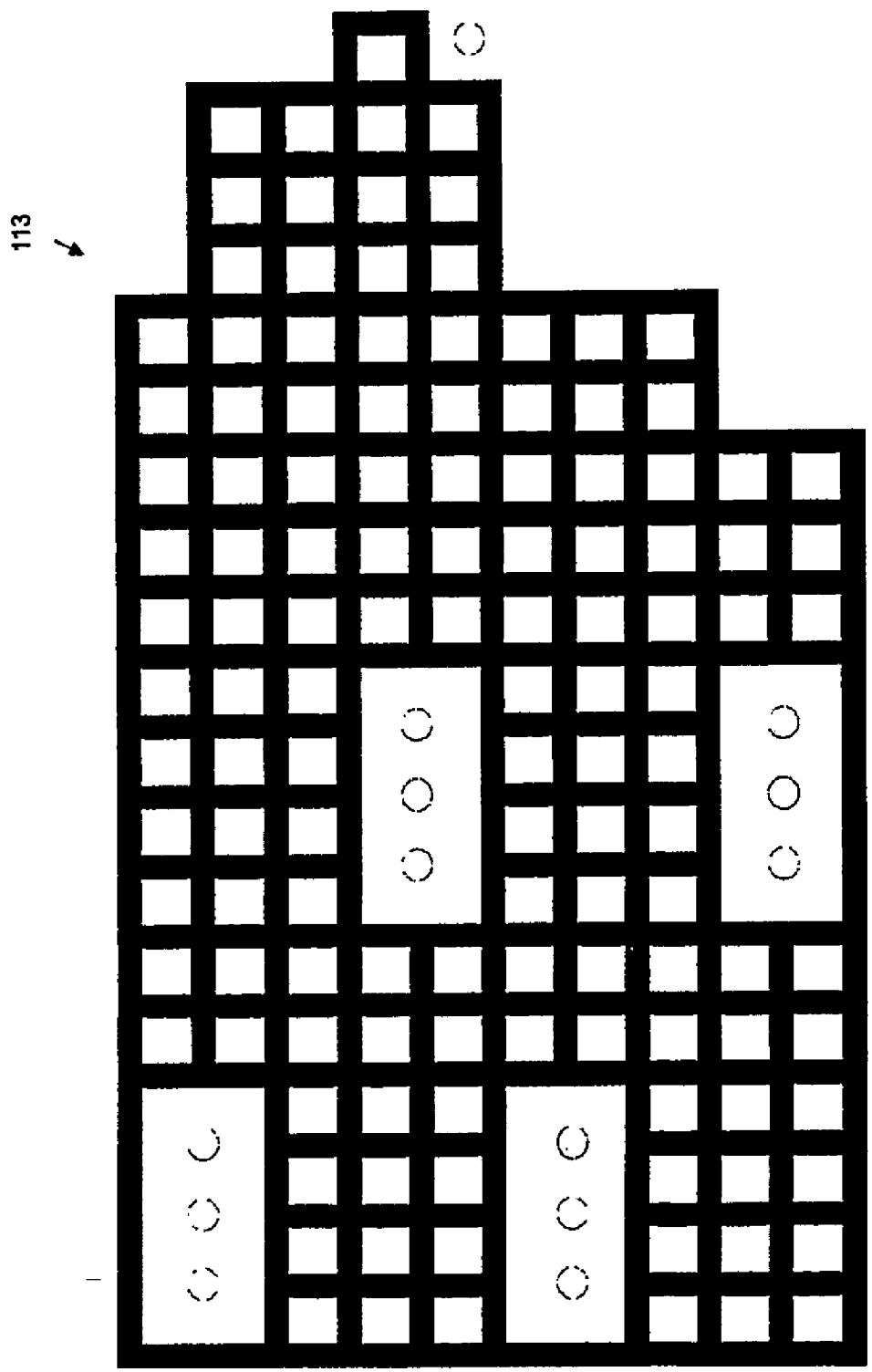
Figure 6:
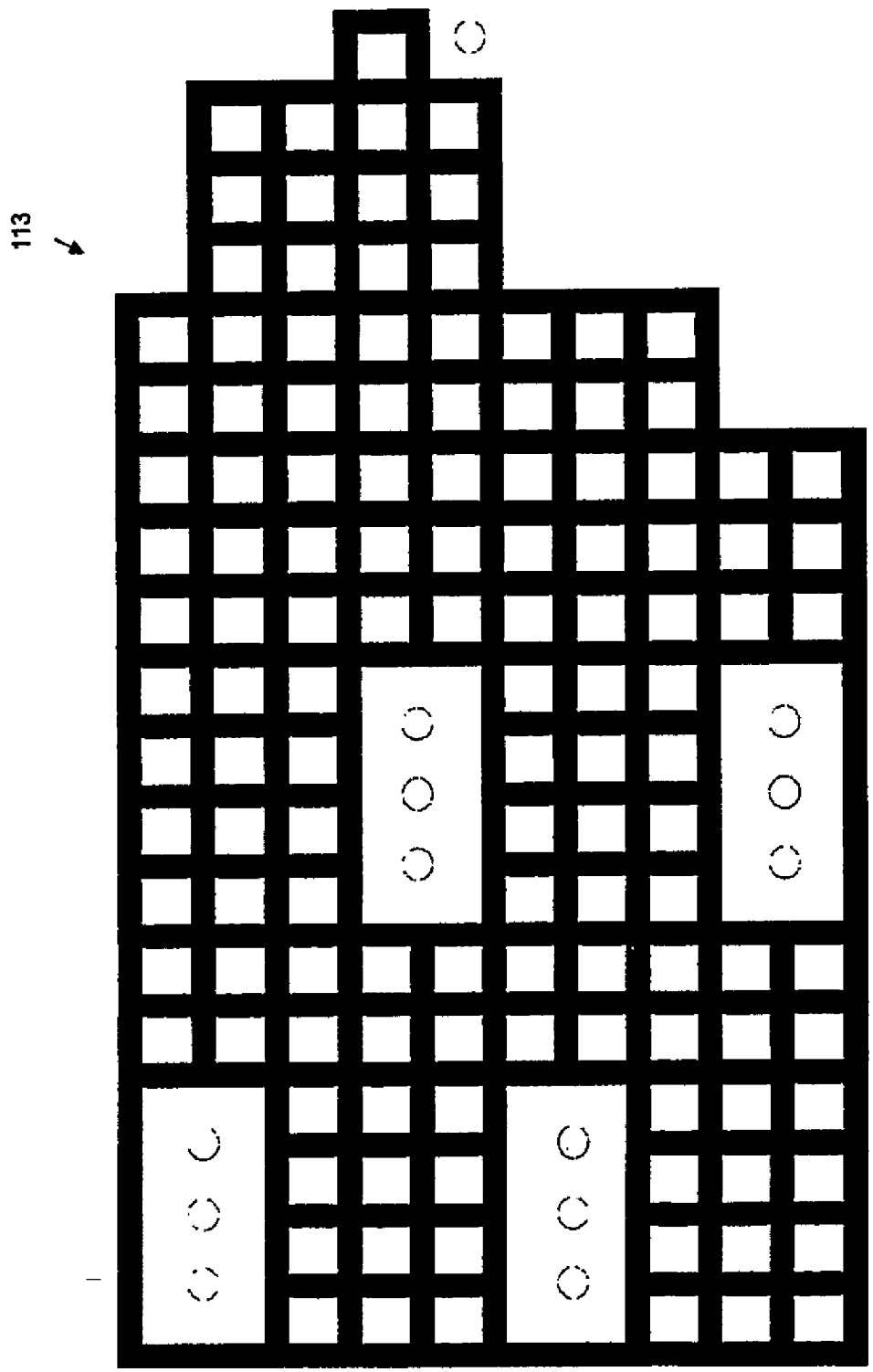
Figure 7:
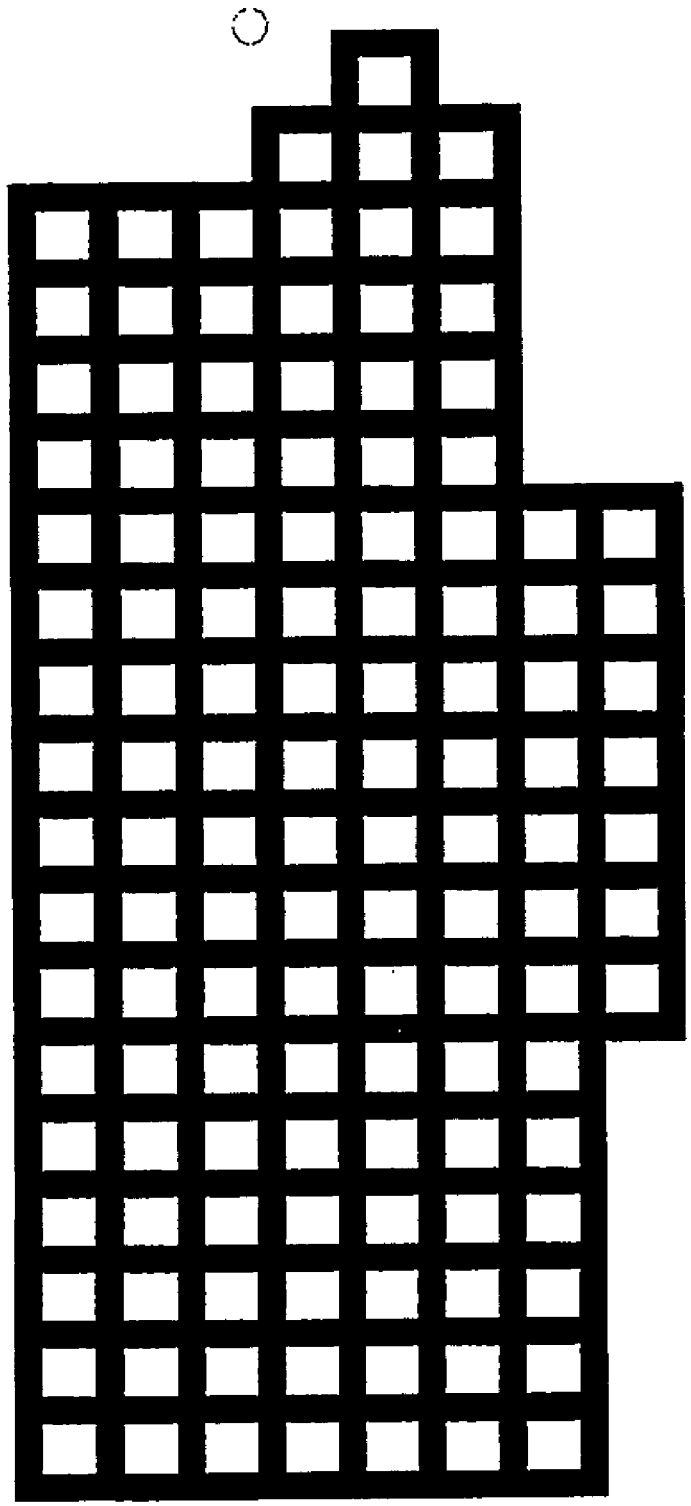

Referring to FIG. 9, the process of locally adjusting the voltage of the current in the power plane 113 comprises establishing a feedback loop 116 between the power plane 113 and a local voltage regulator 126 to actively and constantly sense the reflected voltage at a regulated output port and to actively cancel the time domain noise within its operational bandwidth (900). This ensures an essentially pure and noise-free DC output to the semiconductor chip 160 being supplied. More specifically, due to loop inductance (see item 116 of FIGS. 3 and 4)) that is created by mutual inductance between conductive planes (e.g., the ground planes 115, 114) and due to impedance across the power plane 113, a voltage regulator 126 is positioned as close as possible to the chip 160 and the power plane 113 within the package 102 (e.g., mounted on a top surface 111 of the carrier 110 within approximately 2 mm or less of the semiconductor chip 160) (902–904). The current passing through the power plane 113 is received from a first location 113x near a second location 113y (906) and the voltage of the current is determined (907). The second location 113y is the location where the current is delivered from the power plane 113 to the semiconductor chip 160. The voltage of the current from the first location 113x is compared to a voltage reference level (908). The voltage reference level is that voltage needed to power the circuits on the chip 160 (e.g., the voltage required to power a high speed switching circuit). Depending upon the results of the comparison, the voltage of the current is adjusted up or down to the voltage reference level to establish the voltage-regulated current (910). The steady flow of the voltage-regulated current to the power plane 113 ensures that the voltage-regulated current is maintained within the power plane 113 and instantaneously deliverable to the semiconductor chip 160. Referring back to FIG. 8, as the voltage-regulated current steadily and continuously flows through the power plane 113 it is distributed from the second location 113y on the power plane 113 through a semiconductor via 161 and semiconductor contact 162 to the chip 160. Thus, an instantaneous low impedance current is supplied to power the circuit(s) within the chip 160.

Therefore, the present invention discloses a structure and method for locally powering a semiconductor chip within a package. A voltage regulator is mounted onto a chip carrier adjacent a chip and is electrically connected to a power plane within the carrier. The voltage regulator actively and constantly senses the reflected voltage of the power plane at a regulated output port and actively cancels time domain noise within its operational bandwidth. Mounting the voltage regulator on top of the carrier adjacent to the chip minimizes inductance within the feedback loop between the regulator and power plane and also minimizes delay caused by impedance of the power plane on the current flowing to the chip. This ensures an essentially pure and noise-free DC output to the chip. While the invention has been described in terms of embodiments, those skilled in the art will recognize that the invention can be practiced with modification within the spirit and scope of the appended claims.

What is claimed is:

1. A semiconductor structure comprising:
   a carrier comprising a power plane;
   a voltage regulator mounted on said carrier and electrically connected to said power plane; and
   a semiconductor chip mounted on said carrier and electrically connected to said power plane,
   wherein said power plane is adapted to distribute a current to said semiconductor chip, and
   wherein said voltage regulator is positioned adjacent said semiconductor chip and is adapted to adjust a voltage of said current in said power to a voltage reference level.

2. The semiconductor structure of claim 1, wherein said carrier has a top surface and a bottom surface,
   wherein said voltage regulator is mounted on said top surface of said carrier, and
   wherein said power plane is positioned horizontally within said carrier closer to said top surface of said carrier than said bottom surface.

3. The semiconductor structure of claim 2, wherein said carrier further comprises:
   a first ground plane positioned between said top surface and said power plane; and
   a second ground plane positioned between said top surface and said first ground plane to provide a voltage reference adjacent said voltage regulator.

4. The semiconductor structure of claim 3, wherein said first ground plane, said second ground plane and said power plane comprise conductive planes comprising one of conductive mesh and solid conductive foil.

5. The semiconductor structure of claim 1, wherein said voltage regulator is further adapted to receive said current from said power plane, to determine said voltage of said current, and to compare said voltage of said current to said voltage reference level.

6. The semiconductor structure of claim 1, further comprising a feedback loop between said power plane and said voltage regulator.

7. The semiconductor structure of claim 1, further comprising a circuit module between said carrier and said semiconductor chip, wherein said voltage regulator is connected to said circuit module.

8. The semiconductor structure of claim 1, wherein said voltage regulator is positioned so that inductance on said current passing between said voltage regulator and said power plane is minimized to less than approximately 30 picoHenries.

9. The semiconductor structure of claim 1, wherein said voltage regulator is adapted to continuously adjust said voltage of said current such that voltage fluctuations across said power plane are less than approximately 0.1 volts.

10. A semiconductor structure comprising:
    a carrier comprising a mesh power plane;
    a voltage regulator mounted on said carrier and electrically connected to said mesh power plane; and
    a semiconductor chip mounted on said carrier and electrically connected to said mesh power plane,
    wherein said mesh power plane is adapted to distribute a predetermined impedance current to said semiconductor chip, and
    wherein said voltage regulator is positioned adjacent said semiconductor chip and is adapted to output a voltage-regulated current to said mesh power plane.

11. The semiconductor structure of claim 10, wherein said voltage regulator is further adapted to receive said current from said mesh power plane, to determine said voltage of said current, and to compare said voltage of said current to said voltage reference level.

12. The semiconductor structure of claim 10, further comprising a feedback loop between said power plane and said voltage regulator.

13. The semiconductor structure of claim 10, further comprising a circuit module between said carrier and said semiconductor chip, wherein said voltage regulator is connected to said circuit module.

14. The semiconductor structure of claim 10, wherein said voltage regulator is positioned so that inductance on said current passing between said voltage regulator and said power plane is less than approximately 30 picoHenries.

15. The semiconductor structure of claim 10, wherein said voltage regulator is adapted to continuously adjust said voltage of said current such that voltage fluctuations across said power plane are less than approximately 0.1 volts.

16. The semiconductor structure of claim 10, wherein said mesh power plane comprises a conductive mesh with a minimum line width of approximately 0.06 mm and a minimum line pitch of approximately 0.2 mm,
    wherein resistance of said mesh is between approximately 10 and 30 milliOhms, and
    wherein inductance of said mesh is between approximately 145 and 160 picoHenries so that said mesh power plane provides said predetermined impedance path for said current between said voltage regulator and said chip.

17. A method of powering a semiconductor chip mounted on a carrier of a semiconductor package, said method comprising:
    distributing a current across a power plane within said carrier;
    adjusting a voltage of said current in said power plane to a voltage reference level using a voltage regulator mounted on said carrier to establish a voltage-regulated current across said power plane;
    flowing said voltage-regulated current across said power plane; and
    delivering said voltage-regulated current to said chip, wherein said process of adjusting said voltage comprises adjusting said voltage locally from within said carrier.

18. The method of claim 17, wherein said process of adjusting said voltage of said current further comprises establishing a feedback loop using said voltage regulator, in a process comprising:
receiving a flow of said current from a first location on said power plane to where said current is delivered to said semiconductor chip;
determining a voltage of said current;
comparing said voltage of said current from said first location to said voltage reference level;
adjusting said voltage of said current to said voltage reference level to establish said voltage-regulated current; and
flowing said voltage-regulated current back to said first location.

19. The method of claim 18, wherein said process of establishing said feedback loop further comprises minimizing inductance within said feedback loop by mounting said voltage regulator on a top surface of said carrier.

20. The method of claim 18, wherein said process of establishing said feedback loop further comprises minimizing delay caused by impedance of said power plane on said current to said chip by mounting said voltage regulator on said carrier within approximately 2 mm of said chip.

* * * * *

UNITED STATES PATENT AND TRADEMARK OFFICE
CERTIFICATE OF CORRECTION

| | | |
|---|---|---|
| PATENT NO. | : 7,085,143 B1 | Page 1 of 3 |
| APPLICATION NO. | : 10/908694 | |
| DATED | : August 1, 2006 | |
| INVENTOR(S) | : Warren D. Dyckman et al. | |

Figure 6:
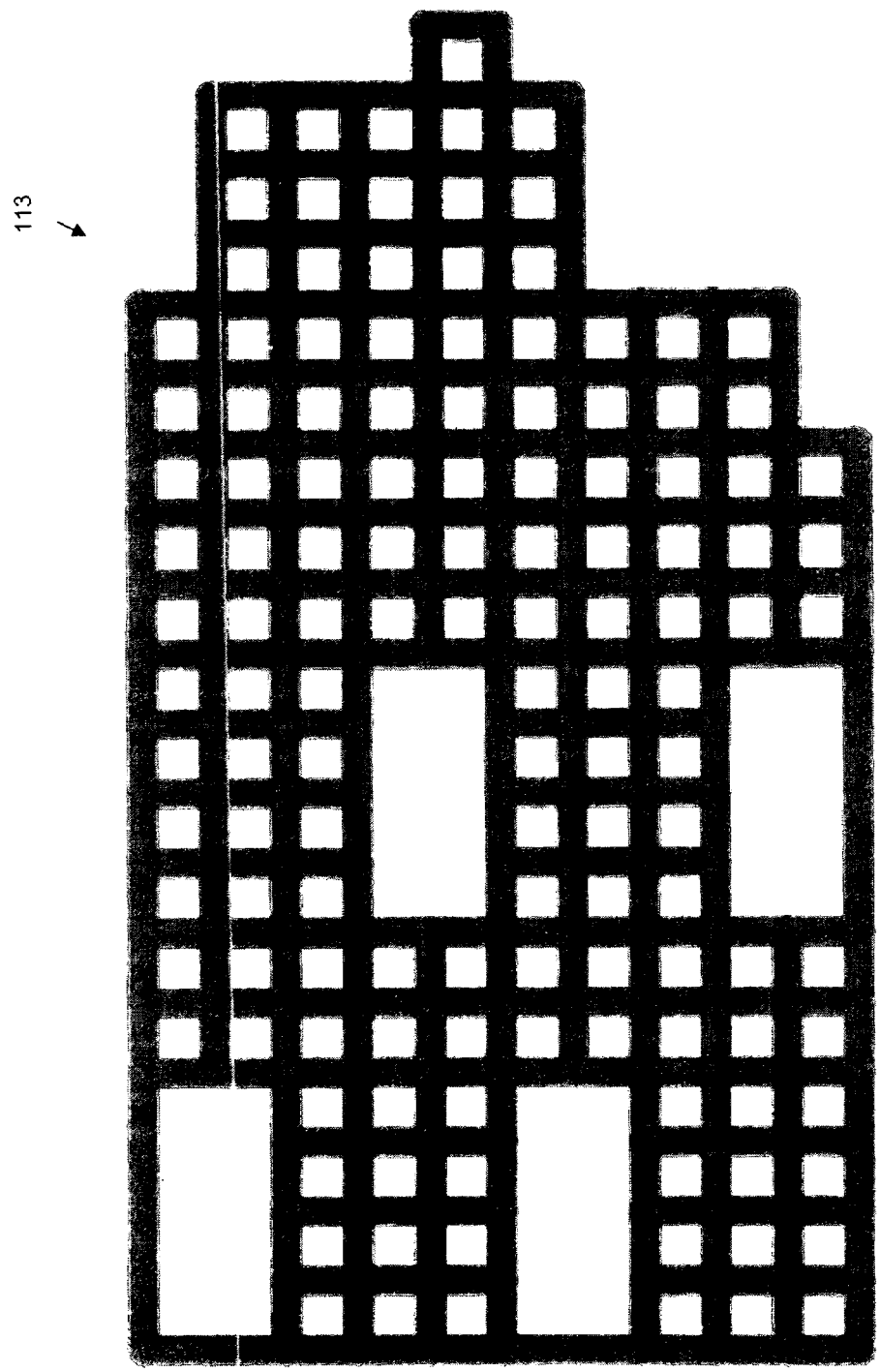
FIG. 6 is a schematic illustration of the mesh ground plane incorporated into an embodiment of the present invention.
Figure 7:
FIG. 7 is a schematic illustration of the mesh power plane incorporated into an embodiment of the present invention.
Figure 8:
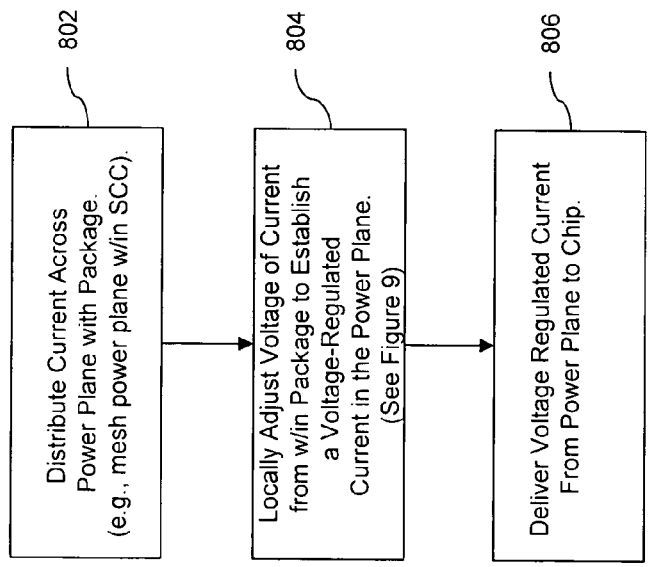
FIG. 8 is a schematic flow diagram illustrating an embodiment of the method of the present invention.

It is certified that error appears in the above-identified patent and that said Letters Patent is hereby corrected as shown below:

Delete Drawing figs. 6 and 7, and substitute Drawing figs 6 and 7 as shown on attached pages.

Signed and Sealed this

Sixteenth Day of January, 2007

JON W. DUDAS
*Director of the United States Patent and Trademark Office*

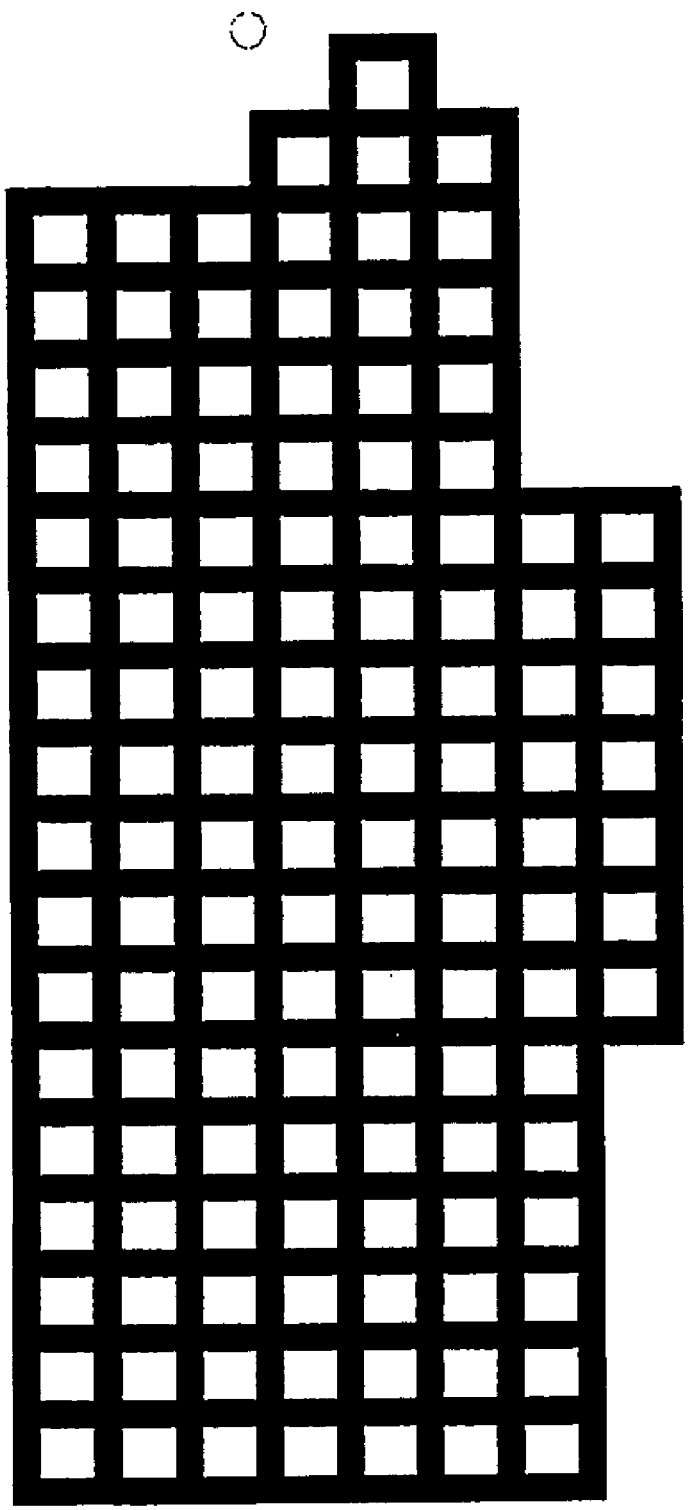

UNITED STATES PATENT AND TRADEMARK OFFICE
CERTIFICATE OF CORRECTION

PATENT NO. : 7,085,143 B1
APPLICATION NO. : 10/908694
DATED : August 1, 2006
INVENTOR(S) : Warren D. Dyckman et al.

It is certified that error appears in the above-identified patent and that said Letters Patent is hereby corrected as shown below:

Delete Drawing figs. 6 and 7, and substitute Drawing figs 6 and 7 as shown on attached pages.

This certificate supersedes Certificate of Correction issued January 16, 2007.

Signed and Sealed this

Sixth Day of February, 2007

JON W. DUDAS
*Director of the United States Patent and Trademark Office*